US007789948B2

(12) United States Patent
Nakamura et al.

(10) Patent No.: US 7,789,948 B2
(45) Date of Patent: Sep. 7, 2010

(54) HYDROGEN SEPARATION MEMBRANE, SPUTTERING TARGET FOR FORMING SAID HYDROGEN SEPARATION MEMBRANE, AND MANUFACTURING METHOD THEREOF

(75) Inventors: Atsushi Nakamura, Ibaraki (JP); Masataka Yahagi, Ibaraki (JP); Akihisa Inoue, Miyagi (JP); Hisamichi Kimura, Miyagi (JP); Shin-ichi Yamaura, Miyagi (JP)

(73) Assignees: Nippon Mining & Metals Co., Ltd, Tokyo (JP); Tohoku University, Miyagi (JP)

( * ) Notice: Subject to any disclaimer, the term of this patent is extended or adjusted under 35 U.S.C. 154(b) by 463 days.

(21) Appl. No.: 11/719,220

(22) PCT Filed: Nov. 4, 2005

(86) PCT No.: PCT/JP2005/020277

§ 371 (c)(1),
(2), (4) Date: May 15, 2007

(87) PCT Pub. No.: WO2006/051736

PCT Pub. Date: May 18, 2006

(65) Prior Publication Data

US 2009/0064861 A1      Mar. 12, 2009

(30) Foreign Application Priority Data

Nov. 15, 2004    (JP)    ............................. 2004-330308

(51) Int. Cl.
*B01D 53/22* (2006.01)
(52) U.S. Cl. ..................... 96/4; 96/11; 95/55; 95/56; 55/523; 55/DIG. 5; 204/298.13; 419/46

(58) Field of Classification Search ............. 95/45, 95/55, 56; 96/4, 11; 55/523, DIG. 5; 204/298.13; 419/1, 23, 46
See application file for complete search history.

(56) References Cited

U.S. PATENT DOCUMENTS 4,992,095 A    2/1991    Nate et al.

(Continued)

FOREIGN PATENT DOCUMENTS

JP    05-017868 A    1/1993

(Continued)

OTHER PUBLICATIONS

Mathaudhu et al., "Progress in Consolidation of Amorphous Zr-based Powder into Bulk Metallic Glass", Material Research Society Symposium Proceedings, vol. 754, pp. CC3.5.1-CC3.5.8, 2003.*

(Continued)

*Primary Examiner*—Jason M Greene
(74) *Attorney, Agent, or Firm*—Howson & Howson LLP

(57) ABSTRACT

Provided is a hydrogen separation membrane characterized by comprising a structure obtained by sintering atomized powder having a composition of $Ni_xM_yZr_{100-x-y}$ (wherein M is Nb and/or Ta, $25 \leq x \leq 40$, $25 \leq y \leq 40$) and an average grain size of 50 μm or less. The prepared hydrogen separation membrane does not require the use of costly Pd metal, and can be used as a substitute for conventional high-cost bulk metallic glass obtained by quenching of molten metal. This hydrogen separation membrane is free from problems such as defects in the hydrogen separation membrane and unevenness of composition, has a uniform structure, and is capable of separating hydrogen at low cost. Further provided are a sputtering target for forming such as hydrogen separation membrane and its manufacturing method.

17 Claims, 7 Drawing Sheets

Element Distribution of Gas Atomized and Hot Pressed NiTaZr and NiNbZr

U.S. PATENT DOCUMENTS

| | | | | |
|---|---|---|---|---|
| 5,518,530 | A | * | 5/1996 | Sakai et al. ............ 96/11 |
| 6,096,640 | A | | 8/2000 | Hu |
| 6,649,559 | B2 | * | 11/2003 | Drost et al. ............ 96/11 |
| 6,761,755 | B2 | * | 7/2004 | Jantsch et al. .......... 96/11 |
| 2002/0106297 | A1 | | 8/2002 | Ueno et al. |
| 2003/0126804 | A1 | | 7/2003 | Rosenflanz et al. |
| 2004/0256035 | A1 | | 12/2004 | Yamakoshi et al. |
| 2006/0037680 | A1 | | 2/2006 | Yamakoshi |
| 2006/0137782 | A1 | | 6/2006 | Yamakoshi et al. |
| 2006/0185771 | A1 | | 8/2006 | Inoue et al. |
| 2009/0139858 | A1 | | 6/2009 | Nakamura et al. |

FOREIGN PATENT DOCUMENTS

| | | | |
|---|---|---|---|
| JP | 2000-144380 A | | 5/2000 |
| JP | 2001-295035 A | | 10/2001 |
| JP | 2004-42017 | * | 2/2004 |
| WO | WO 2004/044260 A1 | * | 5/2004 |

OTHER PUBLICATIONS

ESP@CENET DATABASE, English Abstract of JP 2000-265252, Sep. 26, 2000.

ESP@CENET DATABASE, English Abstract of JP 2000-159503, Jun. 13, 2000.

ESP@CENET DATABASE, English Abstract of JP 2004-162109, Jun. 10, 2004.

Fan et al., "Deformation Behavior of Zr-Based Bulk Nanocrystalline Amorphous Alloys", Physical Review B, vol. 61, No. 6, pp. R3761-R3763, Feb. 1, 2000.

Kakiuchi et al., "Application of Zr-Based Bulk Glassy Alloys to Golf Clubs", Materials Transactions, vol. 4, No. 4, pp. 678-681, Mar. 15, 2001.

Mathaudhu et al., "Progress in Consolidation of Amorphous Zr-Based Powder into Bulk Metallic Glass", Material Society Research Symposium Proceedings, vol. 754, pp. CC3.5.1-CC3.5.8, 2003 (month unknown).

Gu et al., "Structure of Shear Bands in Zirconium-Based Metallic Glasses Observed by Transmission Electron Microscope", Material Society Research Symposium Proceedings, vol. 754, pp. CC7.9.1-CC7.9.6, 2003 (month unknown).

* cited by examiner

Element Distribution of Gas Atomized and Hot Pressed NiTaZr and NiNbZr

Element Distribution of Dissolved and Cast NiTaZr and NiNbZr

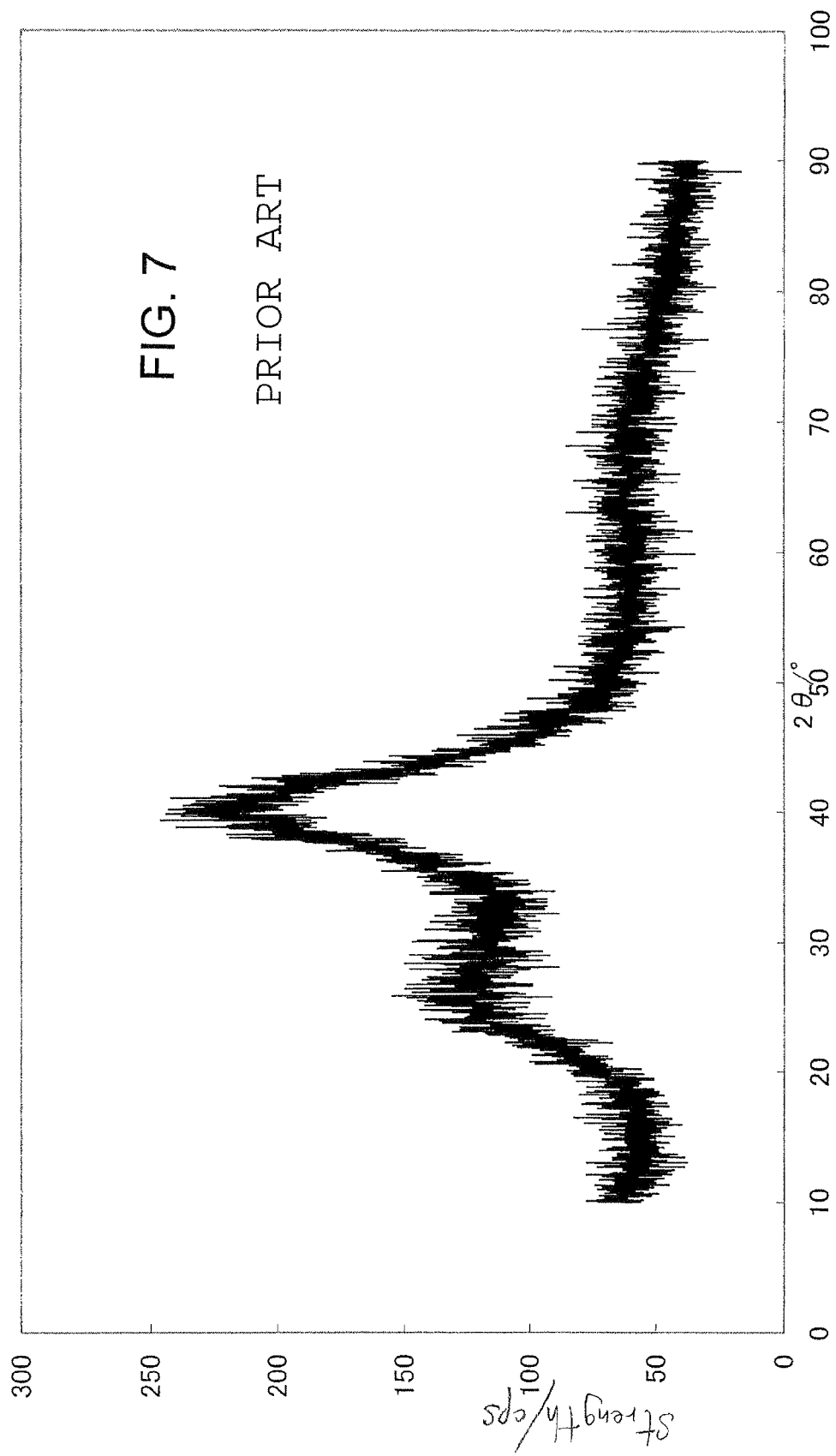

HYDROGEN SEPARATION MEMBRANE, SPUTTERING TARGET FOR FORMING SAID HYDROGEN SEPARATION MEMBRANE, AND MANUFACTURING METHOD THEREOF

BACKGROUND OF THE INVENTION

The present invention relates to a hydrogen separation membrane that does not require the use of costly Pd metal, is of low cost, and has superior hydrogen gas separability. The present invention also relates to a sputtering target for forming such a hydrogen separation membrane and its manufacturing method.

In recent years, there is increasing demand for efficiently separating hydrogen in fuel cells and other items. Generally speaking, since hydrogen produced from fossil fuel or water contains various impurities due to its manufacturing method, it is necessary to perform purification upon separating such impurities in order to obtain high purity hydrogen.

As the purification method, the PSA (Pressure Swing Adsorption) method, membrane separation process, cryogenic distillation method, absorption method and the like may be used. Among the above, the membrane separation process employing a metallic membrane is the only process that is able to manufacture ultrahigh purity hydrogen, which can be put into practical application, at a high yield and with sufficient speed.

The material that is currently being used in the metallic membrane separation process is a Pd—Ag rolled foil using Pd metal, which is a part of the platinum group elements. This Pd—Ag metallic foil has a characteristic feature of selectively occluding hydrogen and is effective as a hydrogen separation material. Nevertheless, there is a problem in that it is extremely expensive in comparison to other materials, and entails a drawback in that the operational conditions are complicated due to hydrogen embrittlement at low temperatures.

In light of the above, numerous materials that do not contain costly Pd have been proposed in the past (refer to Non-Patent Document 1). In particular, there is indication that a Ni—Nb—Zr metallic glass alloy is effective (refer to Non-Patent Documents 2 and 3).

Although the ultrafine processing technique, in particular the deposition technique, is primarily used for forming a hydrogen gas separation membrane, since even the crystal grain boundary of the formed film will become a problem in ultrafine processing, demanded is a deposition method capable of forming a film without a crystal grain boundary; that is, an amorphous membrane or an equivalent film, upon forming a thin membrane.

Meanwhile, as methods of manufacturing bulk metallic glass, proposed are a water quenching method of obtaining virgulate metallic glass by quenching the molten metal enclosed in a silica tube, a method of performing arc melting and quenching with a water-cooled copper mould, a clamping casting method of obtaining metallic glass by melting metal on a copper mold and thereafter pressing this with a cope and quenching the product, a method of performing injection molding at high pressure and quenching this in a copper mold, and a method of manufacturing a metallic glass wire rod by solidifying molten metal on a rotating disk (for instance, refer to Non-Patent Document 4).

Nevertheless, since each of these manufacturing methods is a manufacturing method from molten metal and is subject to quenching, it is necessary to devise the apparatus to meet the quenching conditions, and there is a drawback in that the cost would be extremely high. Further, even when forming a thin membrane, there are limitations, and there is a problem in that it was only possible to form a thin membrane of up to 30 µm in the past.

[Non-Patent Document 1] "Developmental Status of PEFC Electrode, Separator and Hydrogen Separation Membrane Employing Metallic Glass", Written by Naotsugu Meguro, Fuel Cells, Vol. 2, No. 2, 2003, Pages 13 to 17

[Non-Patent Document 2] "Hydrogen Permeation Characteristics of Ni—Nb—Zr Metallic Glass Alloy", Written by Shinichi Yamaura (and 5 others) (680) The Japan Institute of Metals, Spring Convention Lecture Summary (2003), Page 346

[Non-Patent Document 3] Shinichi Yamaura (and 6 others) "Hydrogen Permeation Characteristics of Melt-Spun Ni—Nb—Zr Amorphous Alloy Membranes" Materials Transactions, Vol. 44, No. 9 (2003) pp. 1885-1890

[Non-Patent Document 4] Functional Material "Manufacturing Method of Bulk Metallic Glass", June 2002 Edition, Vol. 22, No. 6, Pages 26 to 31

SUMMARY OF THE INVENTION

In light of the above, an object of the present invention is to provide a hydrogen separation membrane that does not require the use of costly Pd metal, which can be used as a substitute for conventional high-cost bulk metallic glass obtained by quenching of molten metal, is free from problems such as defects in the hydrogen separation membrane and unevenness of composition, has a uniform structure, and is capable of separating hydrogen at low cost. Another object of the present invention is to provide a sputtering target for forming such a hydrogen separation membrane and its manufacturing method.

In order to achieve the foregoing objects, the present invention provides:

1. A hydrogen separation membrane characterized by comprising a structure obtained by sintering atomized powder having a composition of $Ni_xM_yZr_{100-x-y}$ (wherein M is Nb and/or Ta, $25 \leq x \leq 40$, $25 \leq y \leq 40$) and an average grain size of 50 µm or less;
2. The hydrogen separation membrane according to paragraph 1 above, wherein the film thickness is 10 µm or less;
3. The hydrogen separation membrane according to paragraph 1 or paragraph 2 above, wherein the hydrogen separation membrane is an amorphous membrane that shows no peak in XRD (X-ray diffraction);
4. The hydrogen separation membrane according to any one of paragraphs 1 to 3 above, wherein the hydrogen permeability rate is $5 \times 10^{-1}$ mol·m$^{-2}$·s$^{-1}$ or greater;
5. A sputtering target for forming a hydrogen separation membrane comprising a composition of $Ni_xM_yZr_{100-x-y}$ (wherein M is Nb and/or Ta, $25 \leq x \leq 40$, $25 \leq y \leq 40$);
6. The sputtering target for forming a hydrogen separation membrane according to paragraph 5 above, wherein the crystallite size sought from XRD (X-ray diffraction) is 10 Å to 200 Å;
7. The sputtering target for forming a hydrogen separation membrane according to paragraph 5 or paragraph 6 above, wherein a segregated crystal of 1 µm or larger does not exist;
8. A manufacturing method of a sputtering target for forming a hydrogen separation membrane including the step of sintering gas atomized powder comprising a composition of $Ni_xM_yZr_{100-x-y}$ (wherein M is Nb and/or Ta, $25 \leq x \leq 40$, $25 \leq y \leq 40$);
9. The manufacturing method of a sputtering target for forming a hydrogen separation membrane according to paragraph 8 above, wherein the crystallite size sought from XRD (X-ray diffraction) is 10 Å to 200 Å; and 10. The manufacturing method of a sputtering target for forming a hydrogen separation membrane according to paragraph 8 or paragraph 9 above, wherein the average grain size of the atomized powder is 50 μm or less.

The hydrogen separation membrane, sputtering target for forming such hydrogen separation membrane and its manufacturing method according to the present invention yield a superior effect in that the it is possible to obtain a target with high density and a uniform structure according to the sintering method, and, when sputtering is performed using this target, the target surface after sputtering will become a smooth eroded surface, evenness (uniformity) of the film will be favorable, and there is hardly any generation of arcing or particles.

Further, the present invention yields significant effects in that it is possible to make the thickness of the thin membrane much thinner than the bulk body obtained from a conventional molten metal quenching method, the size of the thin membrane can be enlarged without limitation, and the thin membrane can be manufactured without the use of costly Pd metal and is of low cost.

BRIEF DESCRIPTION OF THE DRAWINGS

FIG. 7 is a diagram showing the XRD (X-ray diffraction) profile of a quenched foil (based on roll quenching) of Comparative Example 2.

DETAILED DESCRIPTION OF THE INVENTION

Figure 1:
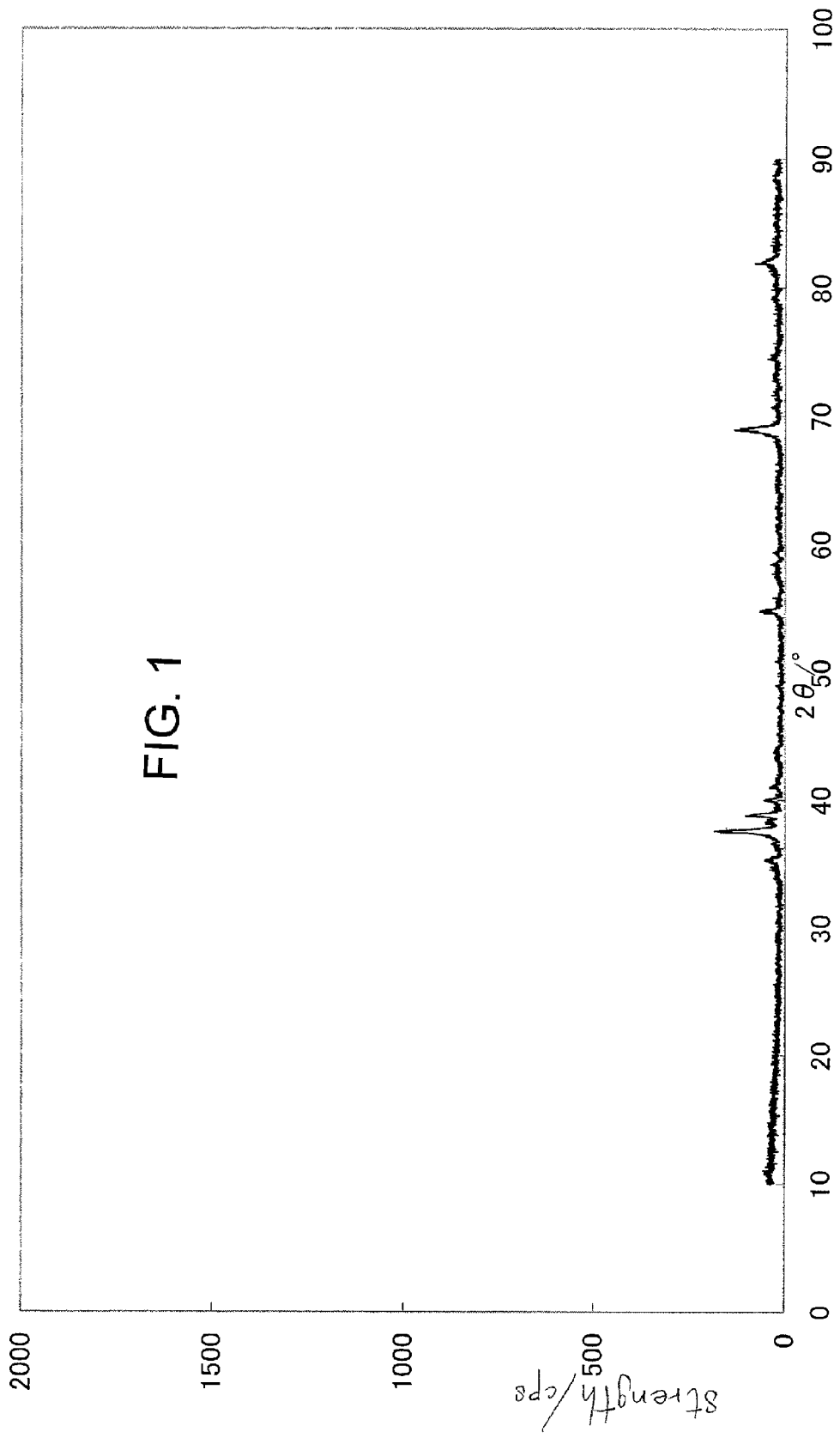
FIG. 1 is a diagram showing the XRD (X-ray diffraction) profile of the target of Example 1.

The hydrogen separation membrane of the present invention comprises a composition of $Ni_xM_yZr_{100-x-y}$ (wherein M is Nb and/or Ta, $25 \leq x \leq 40$, $25 \leq y \leq 40$).

With this metallic glass composition, the tendency is that greater the Zr content, higher the hydrogen permeability coefficient (hydrogen permeability rate per unit area, unit thickness, and unit pressure). When x and y are respectively greater than 40 at %, the Zr content will be less than 20 at %, and it will not be possible to obtain a sufficient hydrogen permeability rate with a film thickness of 10 μm.

Further, when x and y are respectively 25 at % or less, the amorphous stability of the amorphous membrane obtained by sputtering will be inferior, and crystallization will occur easily. When crystallization occurs easily, the mechanical strength and heat characteristics will deteriorate. In light of this, it is necessary to maintain $25 \leq x \leq 40$, $25 \leq y \leq 40$ as the hydrogen separation membrane.

In order to make this membrane function as a hydrogen separation membrane, it is desirable that the film thickness is 10 μm or less. This is because if the film thickness exceeds 10 μm, the function as a hydrogen separation membrane will deteriorate.

Even from the perspective that the limit of thinning the thin membrane obtained with the molten metal quenching method is 30 μm, it is evident that the present invention is dramatically superior.

This hydrogen separation membrane is an amorphous membrane that does not show a peak in XRD (X-ray diffraction) even though it is a membrane obtained by sputtering a sintered target as described later. Further, the hydrogen separation membrane of the present invention yields superior characteristics where the hydrogen permeability rate is $5 \times 10^{-2}$ mol·m$^{-2}$·s$^{-1}$ or greater.

The hydrogen separation membrane of the present invention is obtained by sputtering a target comprising a composition of $Ni_xM_yZr_{100-x-y}$ (wherein M is Nb and/or Ta, $25 \leq x \leq 40$, $25 \leq y \leq 40$).

Generally speaking, the sputtering method is an effective method as a deposition method since the composition, structure, property and so on of the target are directly reflected on the characteristics of the thin membrane. This composition is reflected on the sputtering film obtained by sputtering the target of the present invention, and it is thereby possible to form a favorable hydrogen separation membrane.

With this target, it is possible to make the crystallite size sought from XRD (X-ray diffraction) to be 10 to 200 Å. Moreover, this target is characterized in that a segregated crystal of 1 μm or larger does not exist. If the crystal grain size of the target itself is small, the surface roughness subject to sputtering erosion will become smooth, and this will yield an effect of inhibiting the generation of particles that aggravate the yield of products.

In particular, an amorphous state is the ultimate structural form for reducing particles. Further, the amorphization and ultra-refinement of the structure will improve the uniformity of the target structure and composition, and products employing this method are characterized in that they will not encounter problems such as the non-uniformity of composition and the like.

The sputtering target for forming a hydrogen separation membrane of the present invention can be manufactured by sintering gas atomized powder comprising a composition of $Ni_xM_yZr_{100-x-y}$ (wherein M is Nb and/or Ta, $25 \leq x \leq 40$, $25 \leq y \leq 40$). In particular, by using atomized powder having an average grain size of 50 μm or less, it is possible to reduce the crystallite size of the target, and inhibit the segregation of the target.

The raw material of the foregoing component, for instance, is melted (alloyed) via sealed ampoule melting, arc melting, or high frequency melting, the obtained alloy is re-melted, and, in certain cases, the foregoing raw material melting process is used as is to prepare alloy powder based on an atomization technique such as gas atomization, water atomization, or oil atomization.

Upon manufacturing gas atomized powder, for instance, argon gas is used as the injection gas and injected from a 0.8 mmφ quartz nozzle. The atomized gas pressure, for example, is 80 kgf/cm², and the molten metal gas pressure is 0.3 kgf/cm² upon manufacturing this gas atomized powder.

As the sintering (Spark Plasma Sintering: SPS) conditions, pressure of 600 MPa, and a temperature that is of a crystallization temperature or less are adopted (conditions are changed according to the composition). The foregoing gas atomization and sintering conditions may be arbitrarily changed according to the material, and are not limited to the foregoing conditions.

When setting the sintering conditions, this is basically conducted between the crystallization temperature and glass transition point temperature, and it is desirable to perform sintering near the glass transition point if the sintering density rises to a level that will not cause any practical problems (for instance, a relative density of 90% or higher). Further, it is desirable to keep the heating time during sintering as short as possible in order to maintain the glass state.

This alloy powder is subject to hot pressing or spark plasma sintering (SPS) in order to manufacture a target. With the sputtering target for forming a hydrogen separation membrane of the present invention obtained by sintering, it is possible to make the crystallite size sought from XRD (X-ray diffraction) 1 nm to 20 nm.

The manufactured sintered body is processed into a prescribed shape (surface processing such as machining and polishing) in order to obtain a target. The obtained sputtering target of the present invention had an ultra-fine nano-size uniform structure.

When sputtering is performed using this kind of a target, significant effects are yielded such as being able to realize favorable membrane evenness (uniformity), inhibit the generation of arcing and particles, and even improve the quality of sputtering deposition.

The sputtering target of the present invention does not have to be limited to the deposition of an ultrafine processing technique, and may be used in an amorphous thin membrane or a crystalline thin membrane as a matter of course.

EXAMPLES

Examples of the present invention are now explained. Incidentally, these examples are merely illustrative, and the present invention shall in no way be limited thereby. In other words, the present invention shall include the various modes and modifications covered by the technical spirit of this invention.

Examples 1-10

Ni, Zr, Nb and/or Ta were mixed in a specified quantity as shown in Table 1 and melted in order to prepare a mother alloy. Subsequently, this alloy was melted, and the molten metal was sprayed from a 0.8 mm$\phi$ quartz nozzle by using argon gas as the injection gas to manufacture atomized powder.

Here, the atomized gas pressure was 80 kgf/cm$^2$, and the molten metal gas pressure was 0.3 kgf/cm$^2$. Thereby, atomized powder having a median size (35 to 44 µm) shown in Table 1 was obtained.

Subsequently, the atomized powder was filled in a graphite die, and subject to hot pressing and densified under the conditions of an Ar atmosphere, surface pressure of 300 kg/cm$^2$, temperature of 520° C., and retention time of 1 hour. The obtained sintered body had a density of 7.53 g/cm$^3$ (relative density of 94%), and a high density sintered body was obtained.

The sintered body was processed into a 6-inch, 6 mmt target. The XRD (X-ray diffraction) profile of the obtained target is shown in FIG. 1.

Based on this profile, the average crystallite size calculated from Scherrer's formula was 100 to 125 Å (10 to 12.5 nm) as shown in Table 1, respectively.

Figure 2:
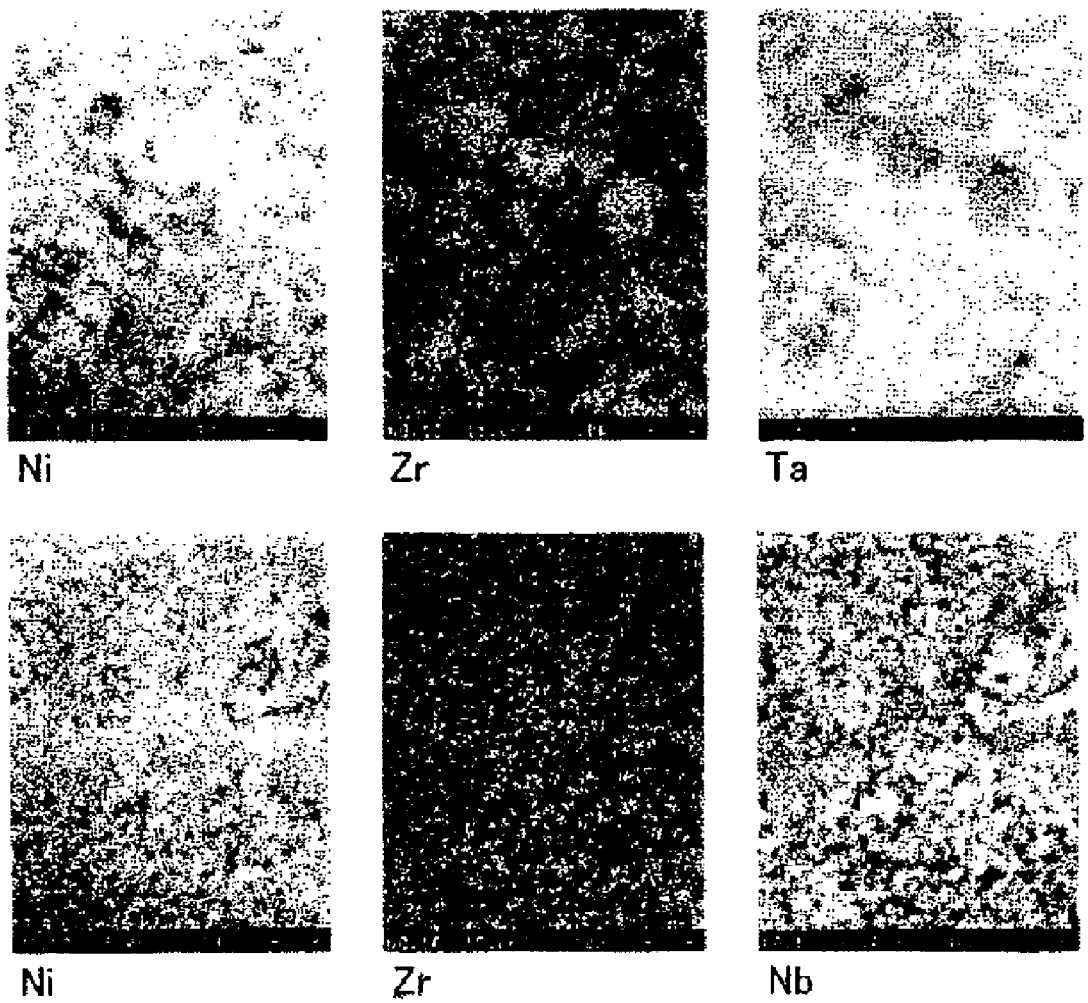
FIG. 2 is a diagram showing the segregation state of the respective elements based on EPMA of the NiTaZr and NiNbZr sintered body targets of Example 1.

Further, evaluation of the segregation state of the respective elements based on EPMA is shown in FIG. 2. The upper row of FIG. 2 shows the case of the target of Example 6, and the lower row shows the case of Example 1, and it is evident that segregation cannot be acknowledged, and the dispersion is uniform. Moreover, the size of the segregated crystal grains of Nb or Ta was <1 µm in all cases as shown in Table 1.

Figure 3:
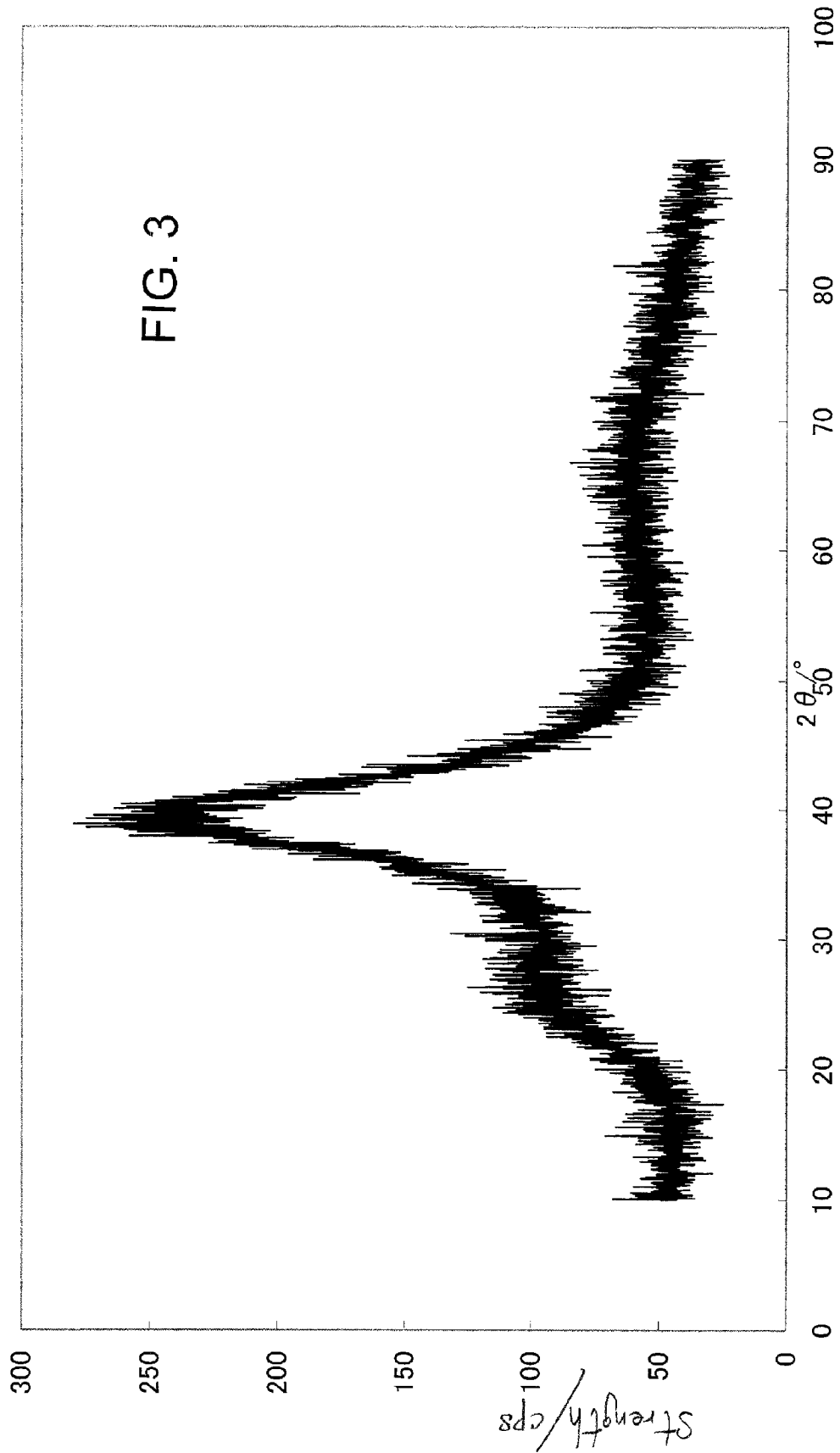
FIG. 3 is a diagram showing the XRD measurement result of the membrane when sputtering is performing with the target of Example 1.

Subsequently, using the target of Example 1, DC sputtering was performed under the conditions of pure Ar, 0.5 Pa and 300 W in order to form a hydrogen separation membrane. The film thickness after deposition was 1 µm. The XRD measurement result of the sputtered membrane is shown in FIG. 3.

The film evenness (uniformity) was favorable, and the generation of arcing and particles could hardly be acknowledged. Further, nodules could not be observed in the target after sputtering, and a smooth eroded surface was obtained. The surface roughness Ra of the target was 220 nm to 280 nm.

Upon measuring the hydrogen permeability rate of the sputtered membrane, the result was $9.5 \times 10^{-2}$ to $1.6 \times 10^{-1}$ mol·m$^{-2}$·s$^{-1}$ as shown in Table 1 under the conditions of 400° C. and hydrogen differential pressure of 1.0 kgf/cm$^2$, and showed favorable permeability. Moreover, no defects such as pinholes or cracks occurred in the membrane before or after measuring the hydrogen permeability.

Comparative Example 1

Ni, Zr, Nb were mixed in a specified quantity as shown in Table 1 and Ar-melted in order to prepare an ingot having a density of 7.94 g/cm$^3$ (relative density of 99%).

Figure 4:
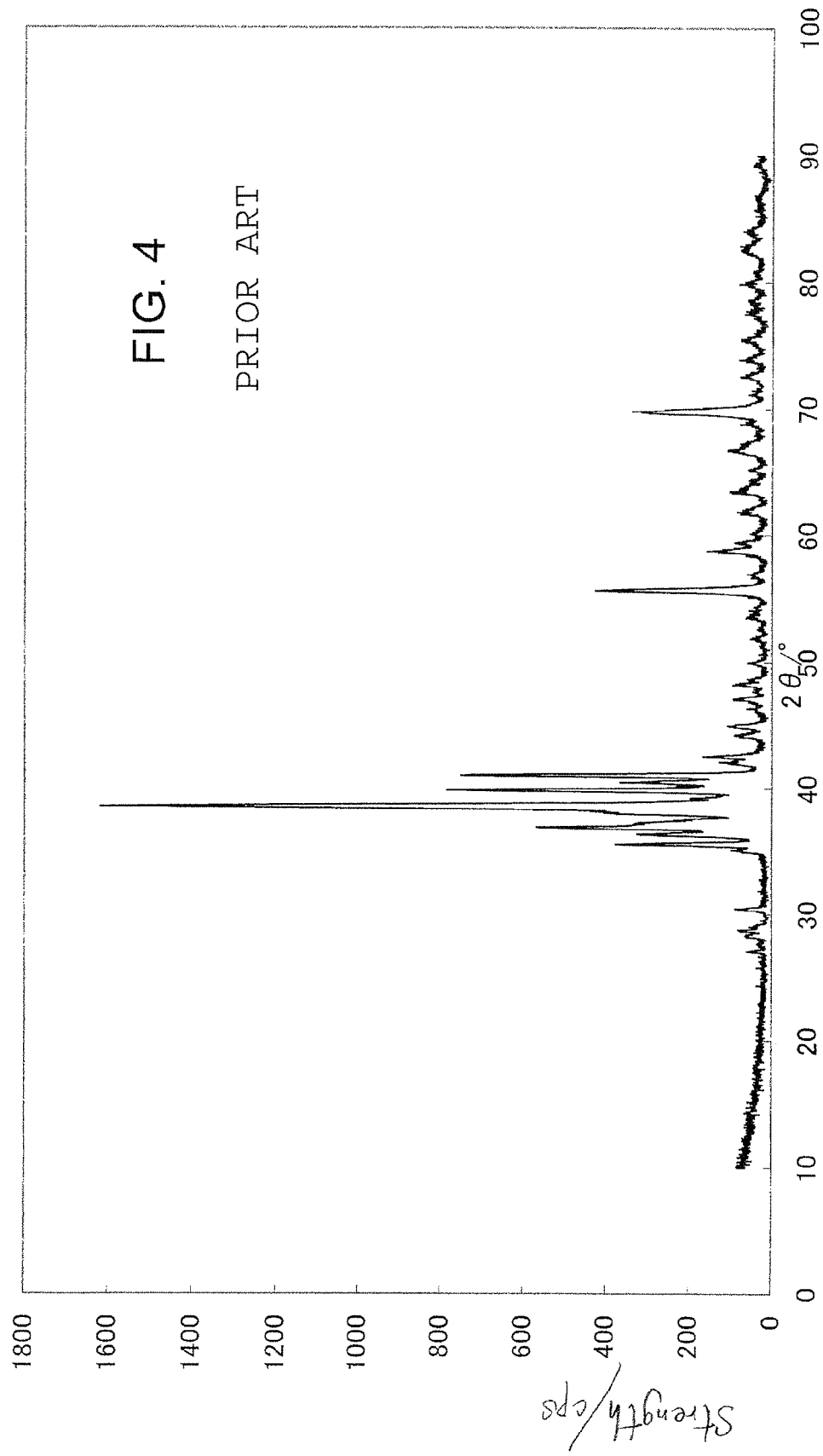
FIG. 4 is a diagram showing the XRD (X-ray diffraction) profile of the target of Comparative Example 1.

This ingot was processed into a 3-inch, 6 mmt target. The XRD (X-ray diffraction) profile of the obtained target is shown in FIG. 4.

Based on this profile, the average crystallite size calculated from Scherrer's formula was 246 Å (24.6 nm) as shown in Table 1, respectively.

Figure 5:
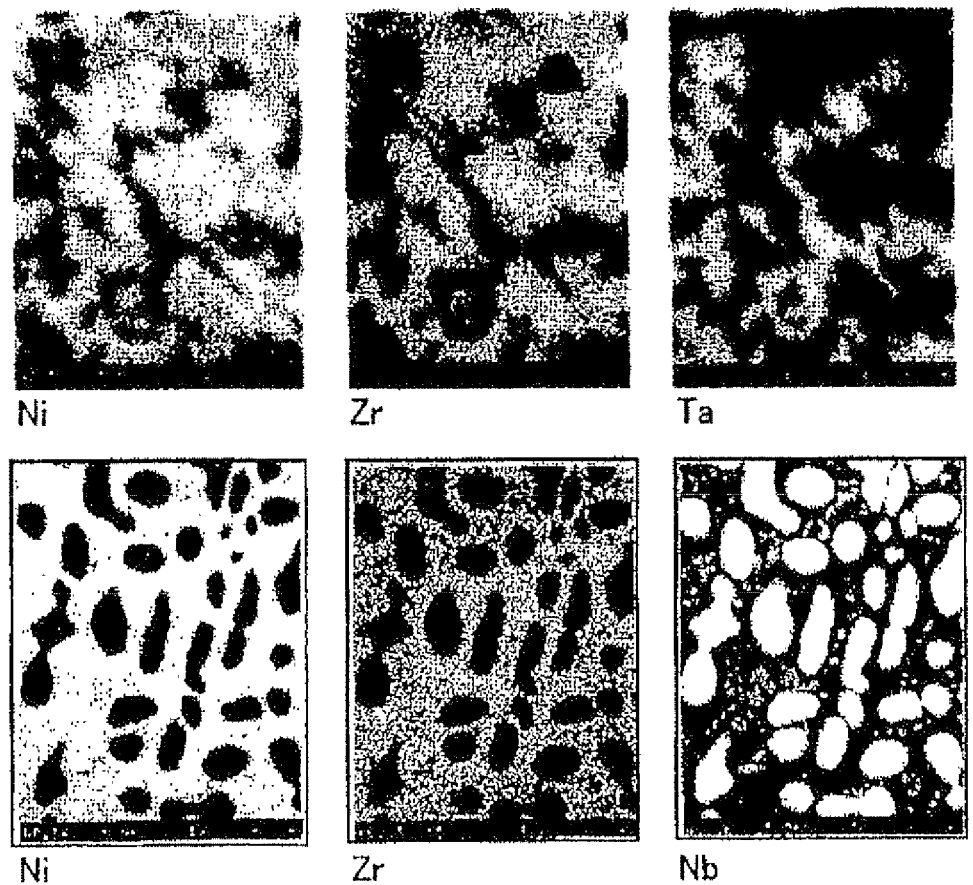
FIG. 5 is a diagram showing the segregation state of the respective elements based on EPMA of the NiTaZr and NiNbZr sintered body targets of Comparative Example 1.

Further, evaluation of the segregation state of the respective elements based on EPMA is shown in FIG. 5. The upper row of FIG. 5 shows the case of a Ni—Zr—Ta alloy manufactured with the same method, and the lower row shows the case of Comparative Example 1. Moreover, the size of the segregated crystal grains of Nb was 50 µm as shown in Table 1.

Figure 6:
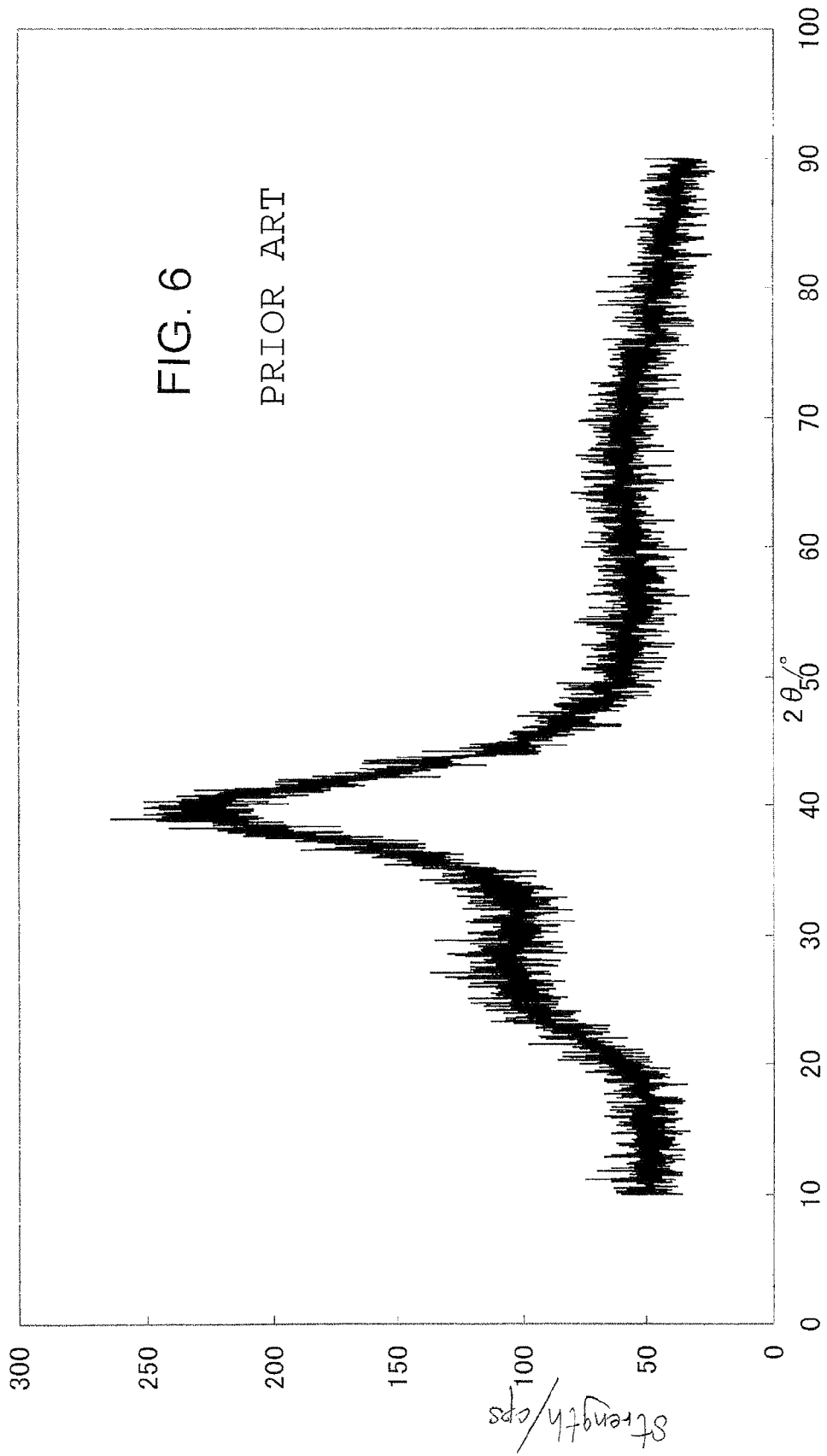
FIG. 6 is a diagram showing the XRD measurement result of the membrane when sputtering is performing with the target of Comparative Example 1.

Subsequently, using this target, DC sputtering was performed under the conditions of pure Ar, 0.5 Pa and 300 W in order to form a hydrogen separation membrane. The film thickness after deposition was 1.1 µm. The XRD measurement result of the sputtered membrane is shown in FIG. 6.

Blackish nodules were observed in the target after sputtering. The surface roughness Ra of the target was 840 nm. Further, defects deemed to be the cause of nodules were observed in the membrane.

Upon measuring the hydrogen permeability rate of the sputtered membrane, the result was $3.4 \times 10^0$ mol·m$^{-2}$·s$^{-1}$ as shown in Table 1 under the conditions of 400° C. and hydrogen differential pressure of 1.0 kgf/cm$^2$. This is greater than the reported hydrogen permeability coefficient of NiNbZr, and a leak was observed. Moreover, there were pinholes in the membrane after measuring the hydrogen permeability.

Incidentally, although Comparative Example 1 illustrated a case of the NiZrNb alloy, the results were the same for the NiTaZr alloy.

Comparative Example 2

Ni, Zr, Nb and/or Ta were mixed in a specified quantity as shown in Table 1 and melted in order to prepare a mother alloy. This alloy was melted with high frequency induction heating and delivered by droplets onto a water cooled copper roll having a rotating speed of 2000 rpm in order to obtain a thin foil with a thickness of 30 to 40 µm.

The XRD profile of this foil is shown in FIG. 7 and, since it showed no peak, the crystallite size could not be calculated.

Further, upon measuring the hydrogen permeability rate of the thin foil, the result was $1.0 \times 10^{-2}$ mol·m$^{-2}$·s$^{-1}$ as shown in Table 1 under the conditions of 400° C. and hydrogen differential pressure of 1.0 kgf/cm$^2$, and showed an inferior hydrogen permeability rate and deterioration in efficiency. Moreover, there were no defects such as pinholes in the membrane after measuring the hydrogen permeability.

Incidentally, although Comparative Example 2 illustrated a case of the NiZrNb alloy, the results were the same for the NiTaZr alloy.

Comparative Example 3

Although gas atomization was performed as with Example 1, the nozzle diameter of atomization was set to 1.5 mm. As a result, coarse powder having a median size of 81 μm was obtained.

The obtained powder was subject to hot pressing as with Example 1 to obtain a sintered body. The crystallite size sought from the profile of the sintered body was 201 Å (20.1 nm), and the size of the segregated crystal was <1 μm.

Defects such as pinholes were discovered in the sputtered membrane obtained by sputtering this target. Upon measuring the hydrogen permeability rate, the result was $2.8 \times 10^{0}$ mol·m$^{-2}$·s$^{-1}$ as shown in Table 1 under the conditions of 400° C. and hydrogen differential pressure of 1.0 kgf/cm$^2$. A leak was observed, and the result was defective as a hydrogen separation membrane.

Incidentally, although Comparative Example 3 illustrated a case of the NiZrNb alloy, the results were the same for the NiTaZr alloy.

The sputtering target for forming a hydrogen separation membrane according to the present invention yields a superior effect in that the obtained target has high density and a uniform structure according to the sintering method, and, when sputtering is performed using this target, the target surface after sputtering will become a smooth eroded surface, evenness (uniformity) of the film will be favorable, and there is hardly any generation of arcing or particles.

Further, the present invention yields significant effects in that it is possible to make the thickness of the thin membrane much thinner than the bulk body obtained from a conventional molten metal quenching method, the size of the thin membrane can be enlarged without limitation, and the thin membrane can be manufactured without the use of costly Pd metal. The sputtered membrane obtained thereby is extremely useful as a hydrogen separation membrane.

The invention claimed is:

1. A hydrogen separation membrane formed by sputtering a sputtering target comprising a structure obtained by sintering atomized powder having an average grain size of 50 μm or less, said membrane consisting of a composition of $Ni_xM_yZr_{100-x-y}$, wherein M is Nb and/or Ta, $25 \leq x \leq 40$, and $25 \leq y \leq 40$.

2. The hydrogen separation membrane according to claim 1, wherein the film thickness is 10 μm or less.

3. A sputtering target for forming a hydrogen separation membrane comprising a structure obtained by sintering atomized powder having an average grain size of 50 μm or less and consisting of a composition of $Ni_xM_yZr_{100-x-y}$ wherein M is Nb and/or Ta, $25 \leq x \leq 40$, and $25 \leq y \leq 40$.

| | Composition | Target Preparation Method | Grain Size of Atomized Powder μm | Size of Target Crystallite Å | Target Segregation μm | Target Ra after Sputtering nm | Film Thickness μm | Film Defect | Hydrogen Transmission Rate mol·m−2·s−1 |
|---|---|---|---|---|---|---|---|---|---|
| Example 1 | Ni35Nb35Zr30 | Gas Atomizing + Powder Metallurgy | 39 | 120 | <1 | 240 | 1.1 | None | 1.4 × 10 − 1 |
| Example 2 | Ni25Nb25Zr50 | Gas Atomizing + Powder Metallurgy | 44 | 110 | <1 | 280 | 1 | None | 1.0 × 10 − 1 |
| Example 3 | Ni25Nb40Zr35 | Gas Atomizing + Powder Metallurgy | 42 | 125 | <1 | 260 | 1 | None | 1.3 × 10 − 1 |
| Example 4 | Ni40Nb25Zr35 | Gas Atomizing + Powder Metallurgy | 38 | 100 | <1 | 220 | 1 | None | 1.4 × 10 − 1 |
| Example 5 | Ni40Nb40Zr20 | Gas Atomizing + Powder Metallurgy | 38 | 100 | <1 | 240 | 1 | None | 1.6 × 10 − 1 |
| Example 6 | Ni35Ta35Zr30 | Gas Atomizing + Powder Metallurgy | 40 | 125 | <1 | 250 | 0.9 | None | 1.2 × 10 − 1 |
| Example 7 | Ni25Ta25Zr50 | Gas Atomizing + Powder Metallurgy | 35 | 110 | <1 | 260 | 1.1 | None | 9.5 × 10 − 2 |
| Example 8 | Ni25Ta40Zr35 | Gas Atomizing + Powder Metallurgy | 41 | 105 | <1 | 250 | 1 | None | 1.1 × 10 − 1 |
| Example 9 | Ni40Ta25Zr35 | Gas Atomizing + Powder Metallurgy | 41 | 100 | <1 | 220 | 1 | None | 1.0 × 10 − 1 |
| Example 10 | Ni40Ta40Zr20 | Gas Atomizing + Powder Metallurgy | 39 | 120 | <1 | 260 | 0.9 | None | 1.4 × 10 − 1 |
| Comparative Example 1 | Ni35Nb35Zr30 | Dissolution and Casting | — | 246 | 50 | 840 | 1.1 | Defective | 3.4 (leak) |
| Comparative Example 2 | Ni35Nb35Zr30 | Dissolution and Single Roll Liquid Quenching | — | <10 | <1 | — | 30 | None | 1.0 × 10 − 2 |
| Comparative Example 3 | Ni35Nb35Zr30 | Gas Atomizing + Powder Metallurgy | 81 | 201 | <1 | 450 | 1 | Defective | 2.8 (leak) |

4. The sputtering target for forming a hydrogen separation membrane according to claim 3, wherein the crystallite size sought from XRD (X-ray diffraction) is 10 Å to 200 Å.

5. A manufacturing method of a sputtering target for forming a hydrogen separation membrane including the step of sintering gas atomized powder having an average grain size of 50 μm or less and consisting of a composition of $Ni_xM_yZr_{100-x-y}$, wherein M is Nb and/or Ta, $25 \leq x \leq 40$, and $25 \leq y \leq 40$.

6. The manufacturing method of a sputtering target for forming a hydrogen separation membrane according to claim 5, wherein the crystallite size sought from XRD (X-ray diffraction) is 10 Å to 200 Å.

7. The sputtering target for forming a hydrogen separation membrane according to claim 3, wherein a segregated crystal of 1 μm or larger does not exist.

8. The sputtering target for forming a hydrogen separation membrane according to claim 4, wherein a segregated crystal of 1 μm or larger does not exist.

9. The hydrogen separation membrane according to claim 2, wherein the hydrogen separation membrane is an amorphous membrane that shows no peak in XRD (X-ray diffraction).

10. The hydrogen separation membrane according to claim 9, wherein the hydrogen permeability rate is $5 \times 10^{-1}$ mol·$m^{-2} \cdot s^{-1}$ or greater.

11. The hydrogen separation membrane according to claim 1, wherein the hydrogen separation membrane is an amorphous membrane that shows no peak in XRD (X-ray diffraction).

12. The hydrogen separation membrane according to claim 11, wherein the hydrogen permeability rate is $5 \times 10^{-1}$ mol·$m^{-2} \cdot s^{-1}$ or greater.

13. The hydrogen separation membrane according to claim 1, wherein the hydrogen permeability rate is $5 \times 10^{-1}$ mol·$m^{-2} \cdot s^{-1}$ or greater.

14. The hydrogen separation membrane according to claim 1, wherein M is Ta thereby requiring said composition to consist of $Ni_xTa_yZr_{100-x-y}$ with $25 \leq x \leq 40$ and $25 \leq y \leq 40$.

15. A sputtering target according to claim 3, wherein M is Ta thereby requiring said composition to consist of $Ni_xTa_yZr_{100-x-y}$ with $25 \leq x \leq 40$ and $25 \leq y \leq 40$.

16. A method according to claim 5, wherein M is Ta thereby requiring said composition to consist of $Ni_xTa_yZr_{100-x-y}$ with $25 \leq x \leq 40$ and $25 \leq y \leq 40$.

17. A method according to claim 5, further comprising the steps of hot pressing the powder to obtain a sintered body and processing the sintered body into a sputtering target.

\* \* \* \* \*